(12) United States Patent
Chen et al.

(10) Patent No.: US 12,080,575 B2
(45) Date of Patent: Sep. 3, 2024

(54) AIRFLOW DETECTION DEVICE AND METHODS OF USE

(71) Applicant: Taiwan Semiconductor Manufacturing Company, Ltd., Hsinchu (TW)

(72) Inventors: Yu-Chen Chen, Hemei Township (TW); Cheng-Lung Wu, Zhunan Township (TW); Yang-Ann Chu, Hsinchu (TW); Jiun-Rong Pai, Jhubei (TW); Ren-Hau Wu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 515 days.

(21) Appl. No.: 17/304,277

(22) Filed: Jun. 17, 2021

(65) Prior Publication Data
US 2022/0301909 A1    Sep. 22, 2022

Related U.S. Application Data

(60) Provisional application No. 63/200,648, filed on Mar. 19, 2021.

(51) Int. Cl.
*H01L 21/67* (2006.01)
*G01F 1/00* (2022.01)
(Continued)

(52) U.S. Cl.
CPC ......... *H01L 21/67253* (2013.01); *G01F 1/00* (2013.01); *G01M 3/32* (2013.01);
(Continued)

(58) Field of Classification Search
CPC ......... H01L 21/67393; H01L 21/67253; H01L 21/67389; H01L 21/67766; H01L 21/67775; G01M 3/32; G01M 3/3209; G01M 3/3236; G01M 3/3254; G01M 9/06; G01F 1/00
See application file for complete search history.

(56) References Cited

U.S. PATENT DOCUMENTS

2008/0156069 A1 * 7/2008 Murata ............... G01D 21/00
73/19.04
2020/0176293 A1 * 6/2020 Lee .................. H01L 21/67017

FOREIGN PATENT DOCUMENTS

WO    WO-2009023787 A2 *  2/2009 ............... G03F 1/66

* cited by examiner

*Primary Examiner* — Benjamin R Schmitt
(74) *Attorney, Agent, or Firm* — Harrity & Harrity, LLP

(57) ABSTRACT

An airflow detection device is capable of detecting airflow issues associated with a transport carrier, such as a blockage of a diffuser in a transport carrier or leakage of a transition bracket, among other examples. The airflow detection device includes an air tunnel through which a gas in a transport carrier may flow. The airflow detection device includes an airflow sensor configured to generate airflow data based on a flow of the gas through the air tunnel. In some implementations, the airflow detection device is included in an airflow detection system to perform automated measurements and to determine, identify, and/or detect airflow issues associated with a transport carrier. In this way, the airflow detection system may perform one or more automated actions (or may cause one or more other devices to perform one or more automated actions) based on a detection of a diffuser blockage or a transition bracket leak.

20 Claims, 10 Drawing Sheets

(51) Int. Cl.
  *G01M 3/32* (2006.01)
  *G01M 9/06* (2006.01)
  *H01L 21/673* (2006.01)
  *H01L 21/677* (2006.01)

(52) U.S. Cl.
  CPC ........ *G01M 3/3209* (2013.01); *G01M 3/3236* (2013.01); *G01M 3/3254* (2013.01); *G01M 9/06* (2013.01); *H01L 21/67389* (2013.01); *H01L 21/67393* (2013.01); *H01L 21/67766* (2013.01); *H01L 21/67775* (2013.01)

AIRFLOW DETECTION DEVICE AND METHODS OF USE

CROSS-REFERENCE TO RELATED APPLICATION

This Patent Application claims priority to U.S. Provisional Patent Application No. 63/200,648, filed on Mar. 19, 2021, and entitled "AIRFLOW DETECTION DEVICE AND METHODS OF USE." The disclosure of the prior Application is considered part of and is incorporated by reference into this Patent Application.

BACKGROUND

Semiconductor wafers and/or other types of substrates may be transported throughout a semiconductor fabrication facility in a transport carrier. A transport carrier may include a wafer cassette, a front-opening unified pod (FOUP), a pod, a container, or a similar type of device. To transfer a semiconductor wafer from a transport carrier to a semiconductor processing tool, the transport carrier may be placed in and/or on a load port associated with the semiconductor processing tool. A transport tool included in an interface tool (e.g., an equipment front end module (EFEM) or similar type of interface tool) that is situated between the semiconductor processing tool and the load port may remove the semiconductor wafer from the transport carrier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
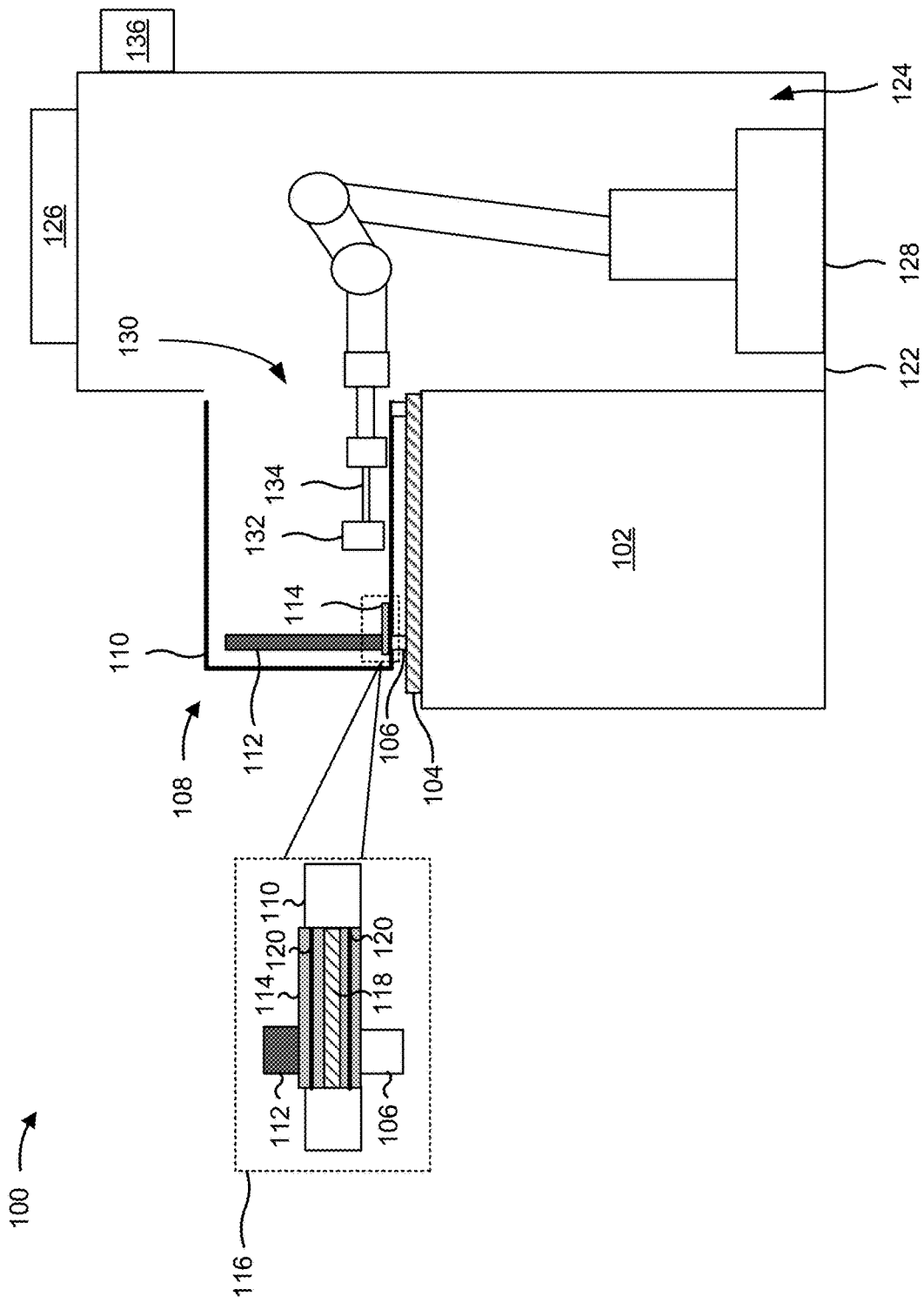
FIG. 1 is a diagram of an example environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While situated on a load port, a purge gas may be provided into a transport carrier through a diffuser in the transport carrier. The purge gas may be cycled through the transport carrier to remove contaminants in the transport carrier and to maintain the humidity in the transport carrier at or within a tolerance of a humidity setting. In some cases, the diffuser in the transport carrier may become blocked (e.g., by debris or other foreign objects), which can cause the humidity level in the transport carrier to rise, can reduce the effectiveness of contaminant removal from the transport carrier, and can cause the transport carrier to vibrate. Vibration of the transport carrier can cause movement and damage to semiconductor wafers and/or other types of substrates in the transport carrier.

Some implementations described herein provide an airflow detection device that is capable of detecting airflow issues associated with a transport carrier, such as a blockage of a diffuser in a transport carrier or leakage of a transition bracket, among other examples. The airflow detection device includes an air tunnel through which a gas in a transport carrier may flow. The airflow detection device includes an airflow sensor configured to generate airflow data based on a flow of the gas through the air tunnel. In some implementations, the airflow detection device is included in an airflow detection system to perform automated measurements and to determine, identify, and/or detect airflow issues associated with a transport carrier. In this way, the airflow detection system may perform one or more automated actions (or may cause one or more other devices to perform one or more automated actions) based on a detection of a diffuser blockage or a transition bracket leak, such as automatically transferring a transport carrier to another location for repair, automatically repairing a transport carrier, and/or one or more other automated actions. This may increase the effectiveness of transport carriers and reduce downtime of transport carriers, which may increase semiconductor wafer yield, may decrease semiconductor wafer defects, and/or may reduce semiconductor wafer repairs.

FIG. 1 is a diagram of an example environment 100 described herein. The example environment 100 may include a testing environment in which transport carriers (e.g., wafer cassettes, front-opening unified pods (FOUPs), pods, containers, and/or similar types of devices) are tested for airflow issues (e.g., leaks, blockages, and/or other types of airflow issues). In some implementations, transport carriers are tested for other types of issues in the example environment 100, including mechanical damage, operational issues (e.g., door opening and closing issues), and/or other types of issues.

As shown in FIG. 1, the example environment 100 includes a load port 102. The load port 102 includes a load port stage 104 and a plurality of ports (or pattern nozzles) 106 on the load port stage 104. The load port stage 104 and the plurality of ports 106 may be configured to receive and support a transport carrier 108 on the load port 102. The load port 102 and the load port stage 104 may receive the transport carrier 108 from a transport robot, a transport cart, an overhead hoist transport (OHT), or another device configured to move transport carriers to and from various locations in a semiconductor processing environment.

The load port 102 is configured to provide gas to the transport carrier 108 through a first subsets of the ports 106, and to purge or extract the gas from the transport carrier 108 through a second subset of the ports 106. The gas is used to purge the transport carrier 108 of contaminants, to maintain the humidity (e.g., relative humidity level) in the transport carrier 108 at or below a humidity setting or a humidity threshold, and/or to control one or more other environmental aspects in the transport carrier 108. The gas includes an inert gas (e.g., argon (Ar), nitrogen ($N_2$), and/or another inert gas), an extra clean dry air (XCDA), and/or another type of gas.

The transport carrier 108 is a wafer cassette, a FOUP, a pod, a container, or a similar type of device configured to hold and/or store a plurality of semiconductor substrates (e.g., semiconductor wafers, semiconductor dies, and/or other types of semiconductor substrates). The transport carrier 108 includes a housing 110 that is configured to receive a door to form a hermetic seal around an opening in the housing 110. In this way, the environment in the transport carrier 108 may be controlled when the door is attached to the housing 110.

The transport carrier 108 includes a diffuser 112 in the housing 110. In some implementations, the transport carrier 108 includes a plurality of diffusers 112. The diffuser 112 is configured to distribute a gas into the transport carrier 108 from the load port 102. The diffuser 112 includes an elongated member that is perforated and attached to a bottom (or another location) of the housing 110 by a transition bracket 114. The gas from the load port 102 is distributed into the transport carrier 108 through a plurality of openings in the diffuser 112.

As shown in a close-up view 116, the transition bracket 114 is inserted into the housing 110. The transition bracket 114 interfaces with a port 106 of the load port 102 to receive the gas from the load port 102. The transition bracket 114 includes a filter 118 to filter the incoming gas into the transport carrier 108 from the load port 102. The filter includes a pleated filter, a paper filter, a high-efficiency particulate absorbing (HEPA) filter, or another type of air filter that is configured to filter or remove particles of the gas prior to entry into the diffuser 112. The transition bracket 114 is secured in the housing 110 by a plurality of gaskets 120 (e.g., rubber gaskets, foam gaskets, and/or another type of gaskets). In some implementations, a first gasket 120 is included around the transition bracket 114 near an inner surface of the housing 110 and a second gasket 120 is included around the transition bracket 114 near an outer surface of the housing 110 to minimize movement of the transition bracket 114 in the housing 110.

The load port 102 is associated with an airflow detection system 122 included in the example environment 100. The airflow detection system 122 is configured to test the transport carrier 108 for airflow-related issues, such as a blockage in the diffuser 112, a leak in the transition bracket 114, a blockage in the filter 118, and/or one or more other airflow-related issues. The airflow detection system 122 includes an enclosure 124 that is environmentally controlled by a fan filter unit (FFU) 126 or another type of environmental control unit.

The airflow detection system 122 includes a robot arm 128 in the enclosure 124. The robot arm 128 includes a six-axis (e.g., a six degrees of freedom movement) robot arm or another type of robot arm. The robot arm 128 is configured to extend into the housing 110 of the transport carrier 108 through an opening 130 of the enclosure 124 to test one or more components of the transport carrier 108 for airflow-related issues.

The robot arm 128 is configured to position an airflow detection device 132 into the transport carrier 108 through the opening 130 in various orientations to test one or more components of the transport carrier 108 for airflow-related issues. In some implementations, the airflow detection device 132 is used to check the diffuser 112 and/or the filter 118 for a blockage, which might otherwise decrease the effectiveness of the gas to control the humidity in the transport carrier 108 and to remove contamination from the transport carrier 108. In some implementations, the airflow detection device 132 is used to check the transition bracket 114 for a leak, which might otherwise allow contaminated air to leak into the transport carrier 108. The airflow detection device 132 is configured to generate airflow data associated with one or more components of the transport carrier 108, as described herein.

The airflow detection device 132 is removably attached to the robot arm 128 by an airflow detection attachment 134. The airflow detection attachment 134 is configured to be attached to and removed from the robot arm 128 so that other types of attachments may be connected to the robot arm 128 so that the robot arm 128 may perform other functions.

As further shown in FIG. 1, the airflow detection system 122 includes a controller 136. The controller 136 includes a processor, a programmable logic control (PLC), a microcontroller, a computer or computing device, or a similar type of device. In some implementations, the controller 136 is mounted or attached to the enclosure 124 of the airflow detection system 122. In some implementations, the controller 136 is located remote from the enclosure 124 of the airflow detection system 122. The controller 136 is communicatively connected with the airflow detection device 132 (e.g., a sensor included therein) and may receive the airflow data generated by the airflow detection system 122. The controller 136 is capable of performing computations to determine, identify, and/or detect airflow-related issues associated with the transport carrier 108, as described herein.

As indicated above, FIG. 1 is provided as an example. Other examples may differ from what is described with regard to FIG. 1.

Figure 2:
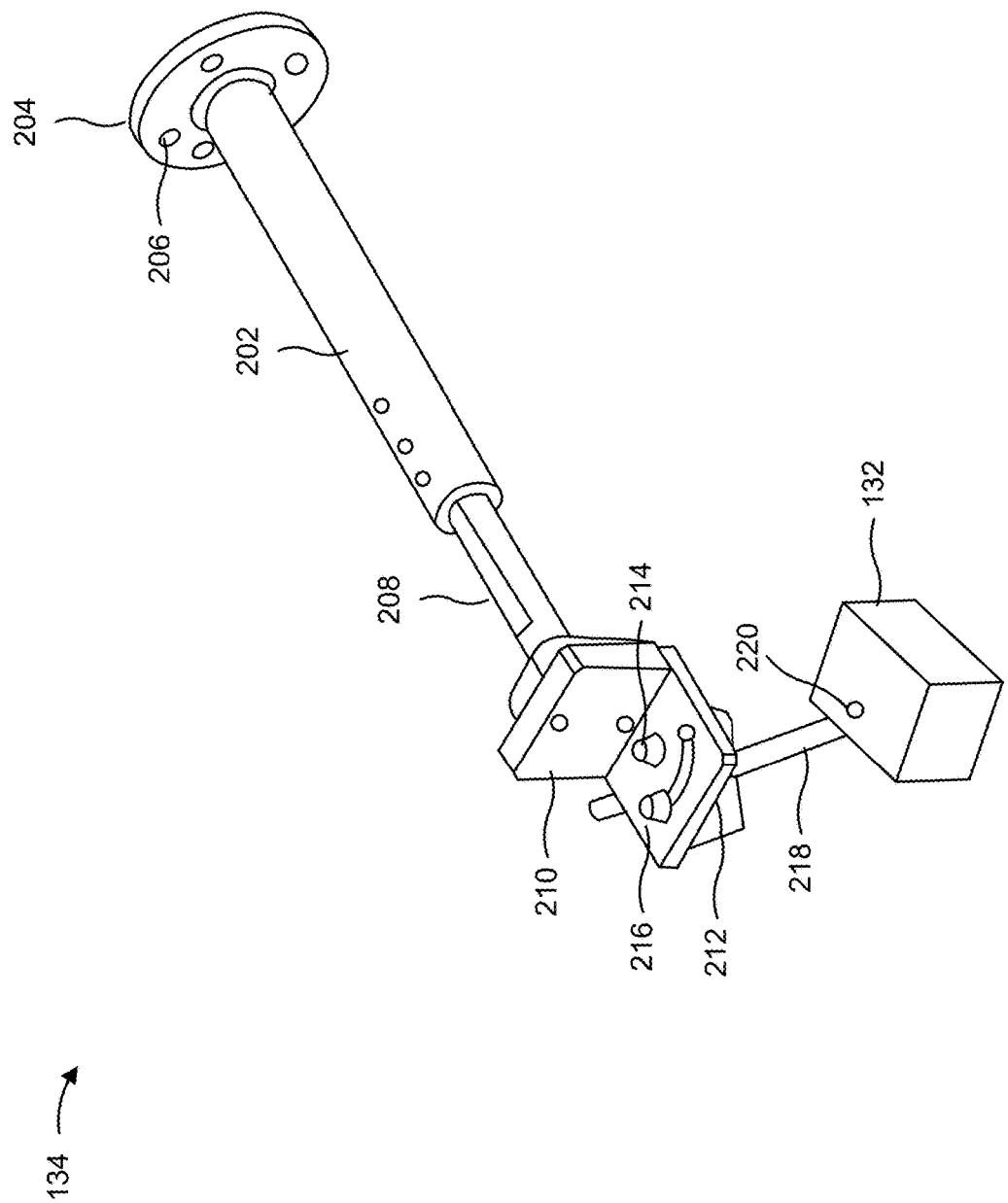
FIG. 2 is a diagram of an example airflow detection attachment described herein.

FIG. 2 is a diagram of the airflow detection attachment 134 described herein. As shown in FIG. 2, the airflow detection attachment 134 includes an elongated body 202 attached to a flange 204. The flange 204 includes a plurality of mounting points 206 through which the airflow detection attachment 134 is attachable to the robot arm 128 by fasteners. In some implementations, the airflow detection attachment 134 is attachable to the robot arm 128 by screws, threaded bolts, pins, bayonet-style mounts, and/or another type of fastener.

The airflow detection attachment 134 includes an extension member 208 that is configured to slide within the elongated body 202. The extension member 208 is configured to be partially extended out of the elongated body 202 to permit the airflow detection device 132 to be positioned in the transport carrier 108 and retracted into the elongated body 202 to remove the airflow detection device 132 from the transport carrier 108.

The extension member 208 is attached to a bracket 210, which includes an L-shaped bracket or another type of bracket. The bracket 210 is attached to a clamp 212 by a plurality of fasteners 214 and 216. The fastener 214 secures the clamp 212 to the bracket 210. The fastener 216 may be loosened to permit the clamp 212 to be rotated relative to the bracket 210 about the fastener 214 so that an angle of a support member 218 relative to the extension member 208 and the elongated body 202 may be adjusted. In this way, the angle of the support member 218 may be adjusted for different sizes of transport carriers and/or for airflow-related issue detection for different types of components in a transport carrier.

The airflow detection device 132 is attached to the support member 218 at a mounting point 220. The mounting point 220 may include an opening through the airflow detection device 132 through which a pin or another type of fastener may be inserted to secure the airflow detection device 132 to the support member 218.

As indicated above, FIG. 2 is provided as an example. Other examples may differ from what is described with regard to FIG. 2.

Figure 3A:
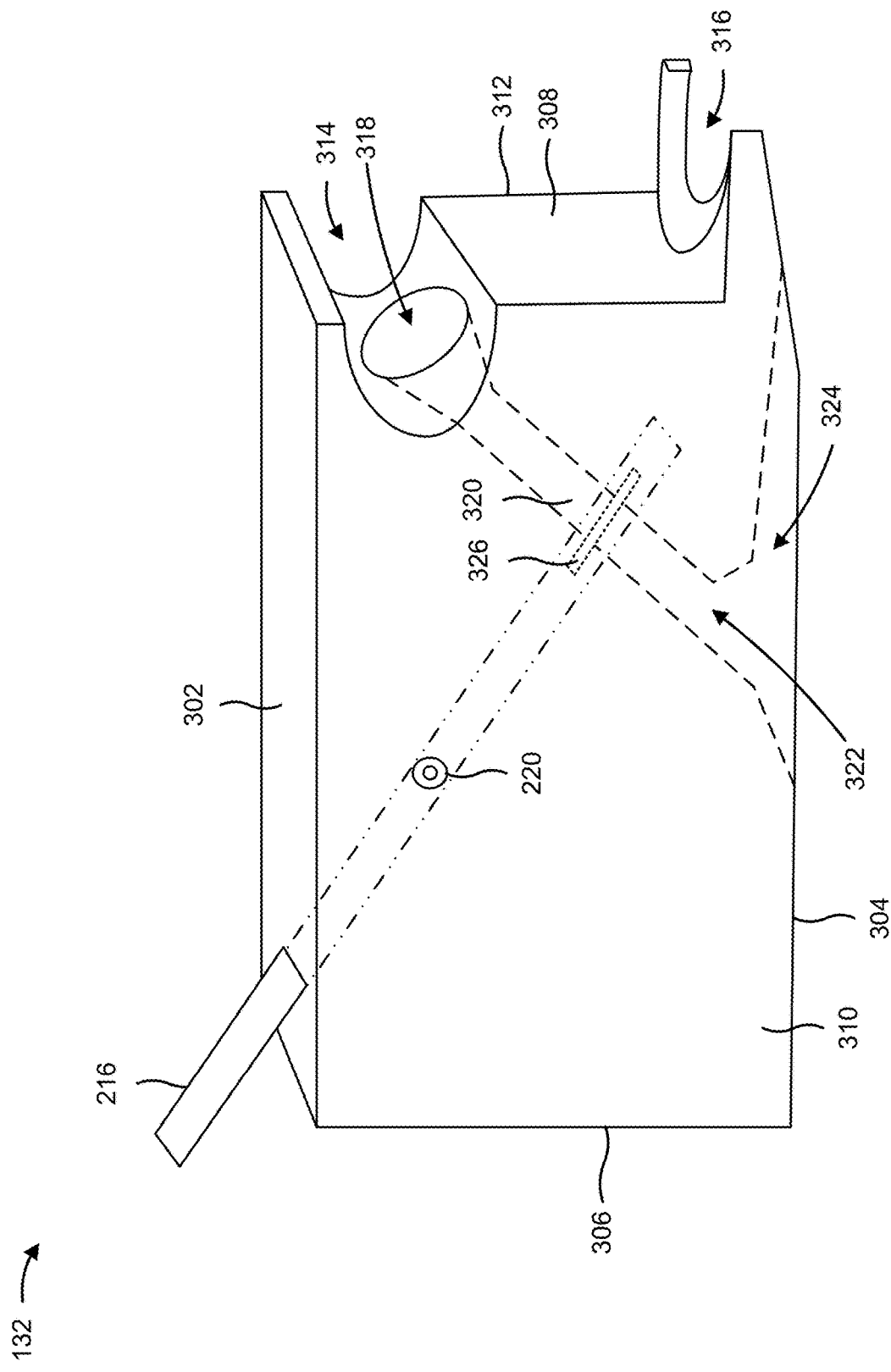
FIGS. 3A-3C are diagrams of an example airflow detection device described herein.
Figure 3B:
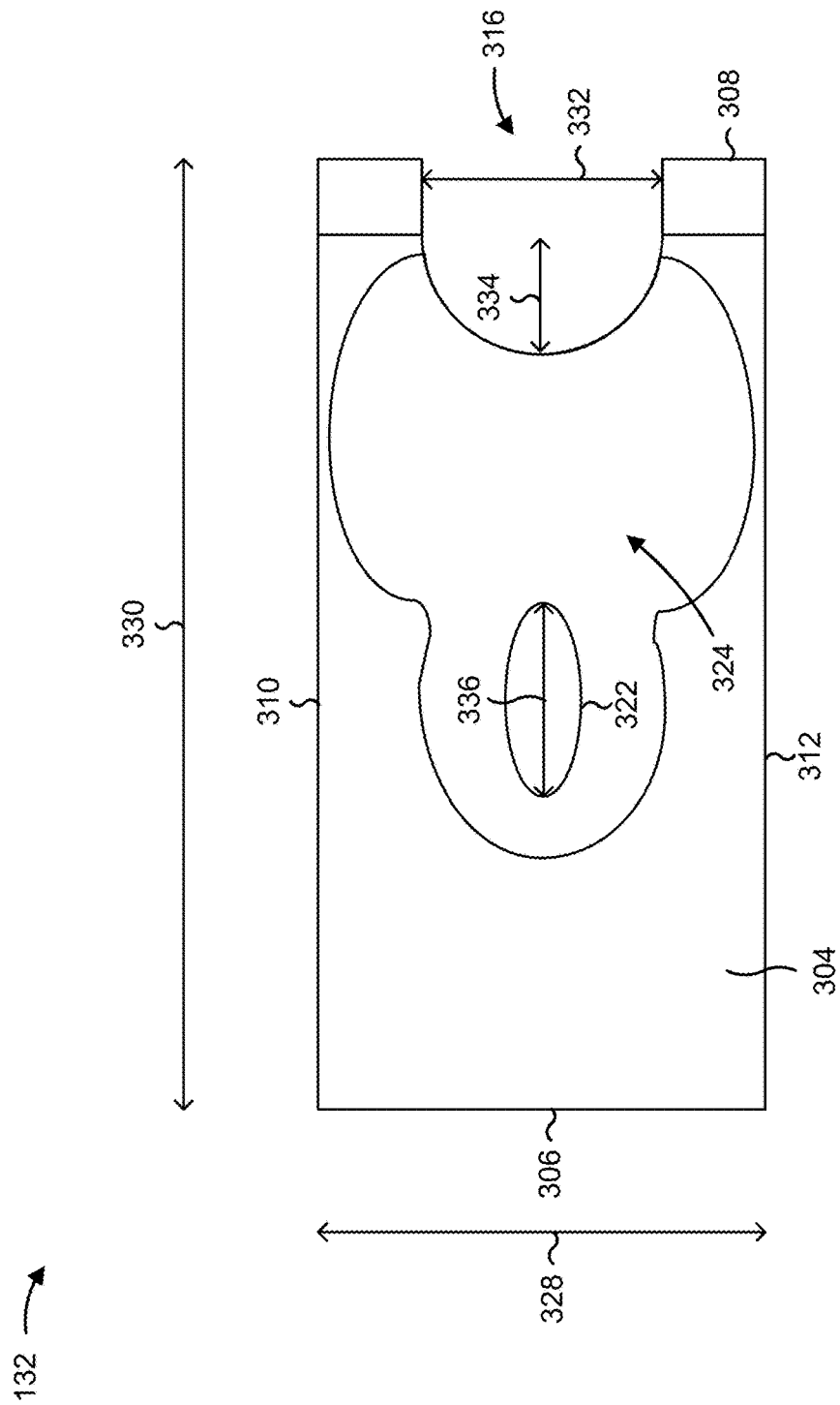
Figure 3C:
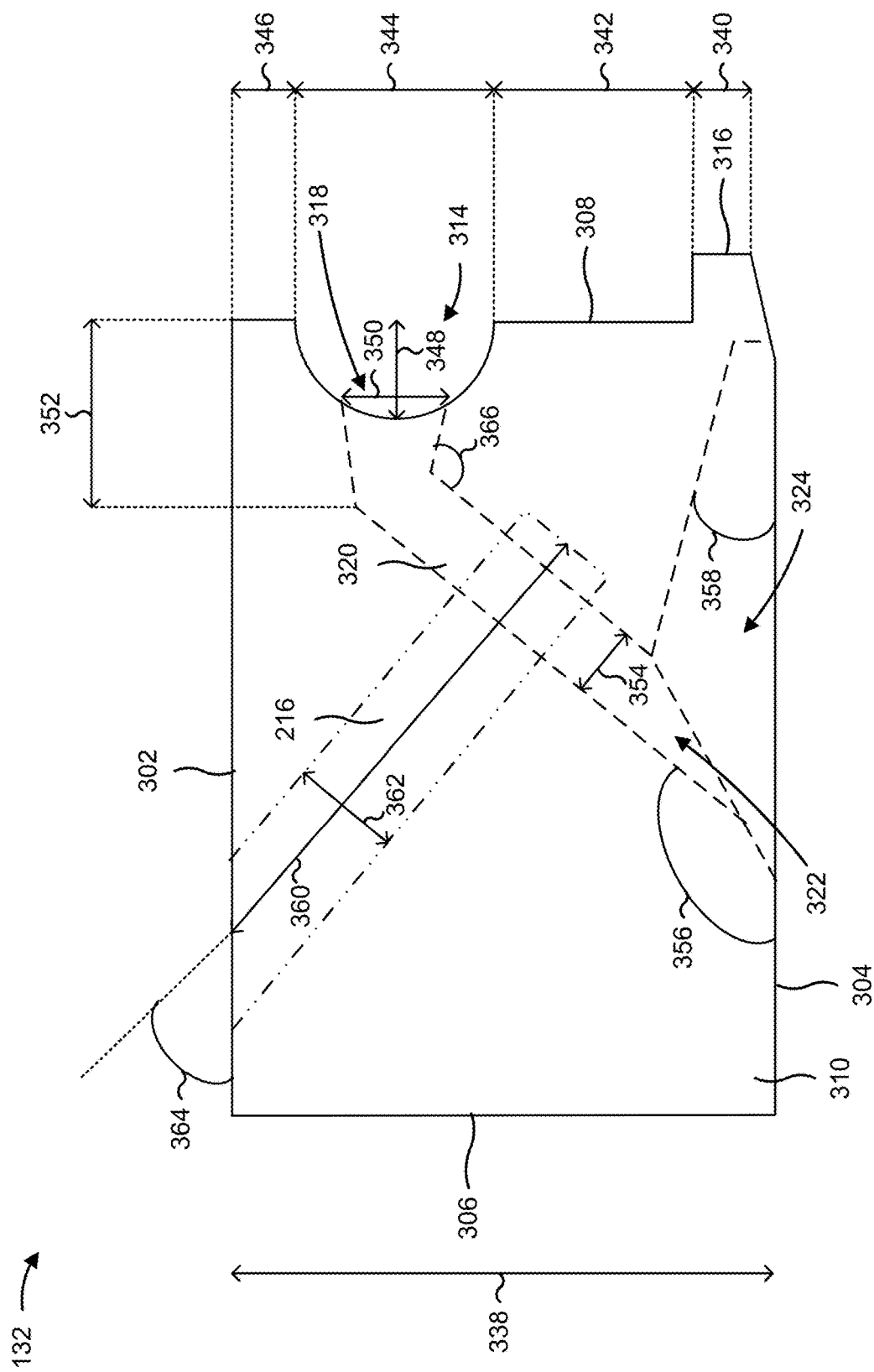

FIGS. 3A-3C are diagrams of the airflow detection device 132 described herein. FIG. 3A illustrates a perspective view of the airflow detection device 132. As shown in FIG. 3A, the support member 218 extends into a portion of the airflow detection device 132 (as indicated by broken lines in FIG. 3A) such that the airflow detection device 132 is capable of being secured to the support member 218 at the mounting point 220.

As further shown in FIG. 3A, the airflow detection device 132 includes a plurality of sides, including a top 302, a bottom 304, a back side 306, a front side 308, a left side 310, and a right side 312. A recessed portion 314 is included on the front side 308 and extends inward into the airflow detection device 132 from the front side 308. The recessed portion 314 is configured to receive the diffuser 112 of the transport carrier 108 when the airflow detection device 132 is orientated to generate airflow data based on a flow of a gas associated with the diffuser 112. Accordingly, the shape of the recessed portion 314 may be configured to conform to the shape of the portion of the diffuser 112 that is to be inserted in the recessed portion 314. As an example, if the diffuser 112 is cylinder shaped, the recessed portion 314 may be half-circle shaped.

Another recessed portion 316 is included on the front side 308 in a portion of the front side 308 that protrudes away from the recessed portion 314. The recessed portion 316 extends inward in the portion of the front side 308 that protrudes away from the recessed portion 314. The recessed portion 316 is configured to receive the diffuser 112 of the transport carrier 108 when the airflow detection device 132 is orientated to generate airflow data based on a flow of a gas associated with the transition bracket 114 of the transport carrier 108. Accordingly, the shape of the recessed portion 316 may be configured to conform to the shape of the portion of the diffuser 112 that is to be inserted in the recessed portion 316. As an example, if the diffuser 112 is square shaped, the recessed portion 316 may be half-square shaped.

An opening 318 is included in the recessed portion 314. The opening 318 is configured to receive a flow of the gas from the diffuser 112. The opening 318 may be connected to an air tunnel 320 in airflow detection device 132. The air tunnel 320 is included in an internal space of the airflow detection device 132 (as indicated by broken lines in FIG. 3A) and extends from the opening 318 in the recessed portion 314 to another opening 322 in a recessed portion 324 on the bottom 304 of the airflow detection device 132. In this way, the air tunnel 320 extends between the front side 308 of the airflow detection device 132 and the bottom 304 of the airflow detection device 132. Gas from the diffuser 112 is permitted to flow into the opening 318, through the air tunnel 320, and out through the opening 322. Gas from the transition bracket 114 is permitted to flow into the opening 322, through the air tunnel 320, and out through the opening 318.

The recessed portion 324 is included on the bottom 304 and extends inward into the airflow detection device 132 from the bottom 304. The recessed portion 324 is configured to permit gas from along the top surface and around the sides of the transition bracket 114 to flow into the opening 322 when the airflow detection device 132 is orientated to generate airflow data based on a flow of a gas associated with the transition bracket 114.

As further shown in FIG. 3A, the airflow detection device 132 includes an airflow sensor 326 that located in a portion of the air tunnel 320. The airflow sensor 326 includes a flow meter or another type of sensor that is configured to generate airflow data based on the flow of gas through the air tunnel 320. Moreover, the airflow sensor 326 is configured to communicate with the controller 136 to transmit an indication of the airflow data to the controller 136 over a wired and/or a wireless connection.

FIG. 3B illustrates a bottom-up view of the airflow detection device 132. FIG. 3B further illustrates a plurality of dimensions of the airflow detection device 132. The airflow detection device 132 includes a width dimension 328 along the back side 306 and the front side 308 between the left side 310 and the right side 312. In some implementations, the width dimension 328 is in a range of approximately 27 millimeters to approximately 33 millimeters to accommodate the size of the support member 218, the air tunnel 320, and the airflow sensor 326, and to provide structural rigidity for the airflow detection device 132. However, other values for the width dimension 328 are within the scope of the present disclosure. The airflow detection device 132 includes a length dimension 330 along the top 302 and the bottom 304 between the back side 306 and the front side 308. In some implementations, the length dimension 330 is in a range of approximately 52 millimeters to approximately 64 millimeters to accommodate the size of the support member 218, the air tunnel 320, and the airflow sensor 326, and to provide structural rigidity for the airflow detection device 132. However, other values for the length dimension 330 are within the scope of the present disclosure.

The airflow detection device 132 includes a width dimension 332 of the recessed portion 316. In some implementations, the width dimension 332 is in a range of approximately 14 millimeters to approximately 18 millimeters to accommodate the size of the diffuser 112. However, other values for the width dimension 332 are within the scope of the present disclosure. The airflow detection device 132 includes a radius dimension 334 of the recessed portion 316. In some implementations, the radius dimension 334 is in a range of approximately 7 millimeters to approximately 9 millimeters to accommodate the size of the diffuser 112. However, other values for the radius dimension 334 are within the scope of the present disclosure. The airflow detection device 132 includes a width dimension 336 of the opening 322. In some implementations, the width dimension 336 is in a range of approximately 19 millimeters to approximately 24 millimeters to permit adequate room for airflow into the air tunnel 320. However, other values for the width dimension 336 are within the scope of the present disclosure.

FIG. 3C illustrates a left-side elevation view of the airflow detection device 132. FIG. 3C further illustrates a plurality of dimensions of the airflow detection device 132. The airflow detection device 132 includes a height dimension 338 between the top 302 and the bottom 304. In some implementations, the height dimension 338 is in a range of approximately 36 millimeters to approximately 44 millimeters to accommodate the size of the support member 218, the air tunnel 320, and the airflow sensor 326, and to provide structural rigidity for the airflow detection device 132. However, other values for the height dimension 338 are within the scope of the present disclosure. The airflow detection device 132 includes a height dimension 340 of the recessed portion 316. In some implementations, the height dimension 340 is in a range of approximately 3 millimeters to approximately 4 millimeters to minimize movement of the airflow detection device 132 when the diffuser 112 is inserted into the recessed portion 316. However, other values for the height dimension 340 are within the scope of the present disclosure.

The airflow detection device 132 includes a distance dimension 342 between the recessed portion 316 and the recessed portion 314. In some implementations, the height dimension 340 is in a range of approximately 13 millimeters to approximately 16 millimeters such that placement of the opening 318 in the recessed portion 314 accommodates the size of the air tunnel 320. However, other values for the distance dimension 342 are within the scope of the present disclosure. The airflow detection device 132 includes a width dimension 344 of the recessed portion 314. In some implementations, the width dimension 344 is in a range of approximately 13 millimeters to approximately 16 millimeters to accommodate the size of the diffuser 112. However, other values for the width dimension 344 are within the scope of the present disclosure.

The airflow detection device 132 includes a distance dimension 346 between the top 302 of the airflow detection device 132 and the recessed portion 314 on the front side 308 of the airflow detection device 132. In some implementations, the distance dimension 346 is in a range of approximately 4 millimeters to approximately 6 millimeters to provide adequate strength for the recessed portion 314. However, other values for the distance dimension 346 are within the scope of the present disclosure. The airflow detection device 132 includes a radius dimension 348 of the recessed portion 314. In some implementations, the radius dimension 348 is in a range of approximately 6 millimeters to approximately 9 millimeters to accommodate the size of the diffuser 112. However, other values for the radius dimension 348 are within the scope of the present disclosure.

The airflow detection device 132 includes a width dimension 350 of the opening 318. In some implementations, the width dimension 350 is in a range of approximately 5 millimeters to approximately 7 millimeters to permit adequate room for airflow into the air tunnel 320. However, other values for the width dimension 350 are within the scope of the present disclosure. The airflow detection device 132 includes a distance dimension 352 between the front side 308 and a back of the opening 318. In some implementations, the distance dimension 352 is in a range of approximately 12 millimeters to approximately 16 millimeters to permit adequate room for airflow into the air tunnel 320. However, other values for the distance dimension 352 are within the scope of the present disclosure.

The airflow detection device 132 includes a width dimension 354 of the air tunnel 320. In some implementations, the width dimension 354 is in a range of approximately 4 millimeters to approximately 6 millimeters to permit adequate room for airflow through the air tunnel 320. However, other values for the width dimension 354 are within the scope of the present disclosure. The airflow detection device 132 includes an angle dimension 356 between the bottom 304 and the air tunnel 320. In some implementations, the angle dimension 356 is in a range of approximately 115 degrees to approximately 145 degrees to minimize turbulence in the air tunnel 320 and to provide a smooth transition between the air tunnel and the openings 318 and 322. However, other values for the angle dimension 356 are within the scope of the present disclosure.

The airflow detection device 132 includes an angle dimension 358 between the bottom 304 and the recessed portion 324. In some implementations, the angle dimension 358 is in a range of approximately 9 degrees to approximately 11 degrees to minimize turbulence in the air tunnel 320 and to provide a smooth transition between the bottom 304 and the recessed portion 324. However, other values for the angle dimension 358 are within the scope of the present disclosure. The airflow detection device 132 includes a length dimension 360 of the opening in which the support member 218 extends into the airflow detection device 132. In some implementations, the length dimension 360 is in a range of approximately 34 millimeters to approximately 42 millimeters to provide adequate strength and rigidity for the connection between the support member 218 and the airflow detection device 132. However, other values for the length dimension 360 are within the scope of the present disclosure.

The airflow detection device 132 includes a width dimension 362 of the opening in which the support member 218 extends into the airflow detection device 132. In some implementations, the width dimension 362 is in a range of approximately 7 millimeters to approximately 9 millimeters to provide adequate strength and rigidity for the connection between the support member 218 and the airflow detection device 132. However, other values for the width dimension 362 are within the scope of the present disclosure. The airflow detection device 132 includes an angle dimension 364 between the opening in which the support member 218 extends into the airflow detection device 132 and the top 302 of the airflow detection device 132.

In some implementations, the angle dimension 364 is in a range of approximately 36 degrees to approximately 44 degrees to provide adequate strength and rigidity for the connection between the support member 218 and the airflow detection device 132. However, other values for the angle dimension 364 are within the scope of the present disclosure. The airflow detection device 132 includes an angle dimension 366 between the opening 318 and the air tunnel 320. In some implementations, the angle dimension 366 is in a range of approximately 45 degrees to approximately 55 degrees to minimize turbulence in the air tunnel 320 and to provide a smooth transition between the opening 318 and the air tunnel 320. However, other values for the angle dimension 366 are within the scope of the present disclosure.

As indicated above, FIGS. 3A-3C are provided as examples. Other examples may differ from what is described with regard to FIGS. 3A-3C.

Figure 4:
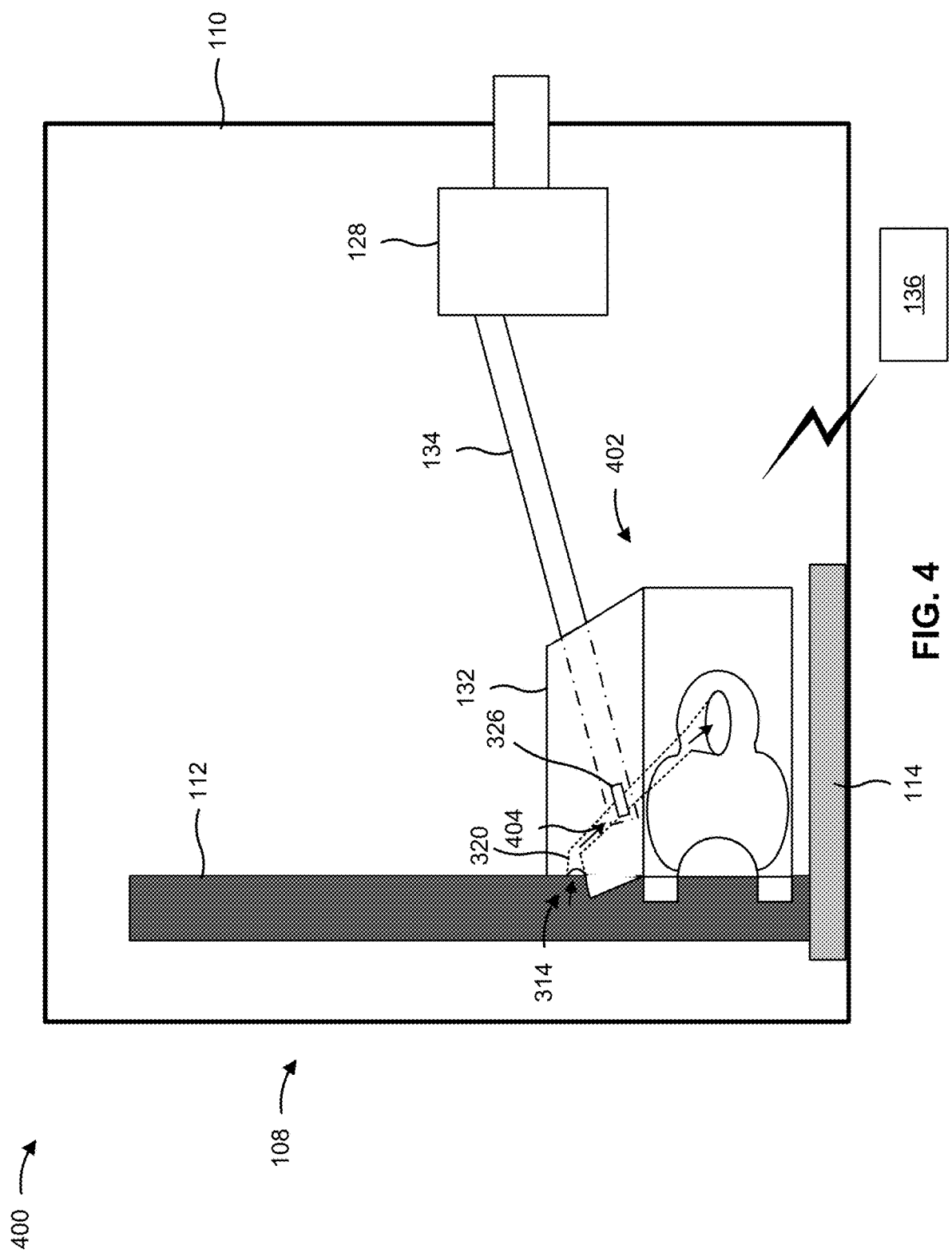
FIGS. 4 and 5 are diagrams of example implementations described herein.

FIG. 4 is a diagram of an example implementation 400 described herein. The example implementation 400 includes an example procedure for checking the diffuser 112 and/or the filter 118 of the transport carrier 108 for a blockage by the airflow detection system 122.

As shown in FIG. 4, the robot arm 128 of the airflow detection system 122 may position the airflow detection device 132 in the transport carrier 108 in an orientation 402 to interface the airflow detection device 132 with the diffuser 112. The orientation 402 may include an orientation of the airflow detection device 132 in which the diffuser 112 is at least partially inserted into the recessed portion 314 of the airflow detection device 132. In some implementations, the airflow detection device 132 is orientated in the orientation 402 in a range of approximately 60 degrees to approximately 90 degrees relative to an orientation in which the airflow detection device 132 is used to check the transition bracket 114 for a leak. However, other values for the relative orientation of the airflow detection device 132 are within the scope of the present disclosure.

In some implementations, the controller 136 transmits a signal to the robot arm 128 to cause the robot arm 128 to position the airflow detection device 132 in the transport carrier 108 in the orientation 402. In some implementations, the controller 136 causes the robot arm 128 to position the airflow detection device 132 in the transport carrier 108 based on determining that the transport carrier 108 is positioned on the load port 102. In some implementations, the controller 136 causes the robot arm 128 to position the airflow detection device 132 in the transport carrier 108 based on receiving an instruction to initiate a test of the transport carrier 108. In some implementations, the controller 136 causes the robot arm 128 to position the airflow detection device 132 in the orientation 402 after the transition bracket 114 is checked for leaks. In these implementations, the controller 136 causes the robot arm 128 to rotate the airflow detection device 132 from the orientation in which the airflow detection device 132 is used to check the transition bracket 114 for a leak to the orientation 402.

With the airflow detection device 132 orientated in the orientation 402, the load port 102 provides a gas into the transport carrier 108 through the transition bracket 114 and the diffuser 112. The gas may flow out of a portion of the diffuser 112 and into the air tunnel 320 through the opening 318 in the recessed portion 314. The gas flows through the air tunnel 320 past the airflow sensor 326 and out of the air tunnel 320 through the opening 322 at the opposing end of the air tunnel 320.

The airflow sensor 326 generates airflow data of a flow 404 of the gas through the air tunnel 320. The airflow data includes a signal, a communication, a voltage, a current, and/or another type of data based on the flow 404 of the gas. In some implementations, the airflow sensor 326 generates the airflow data based on a flow rate of the flow 404 of the gas through the air tunnel 320. The flow rate may be indicated as a cubic meters per second (m$^3$/s) volumetric flow rate or another type of flow rate measurement. In some implementations, the airflow sensor 326 generates the airflow data based on an air speed of the flow 404 of the gas through the air tunnel 320. The air speed may be indicated as a meters per second (m/s) air speed or another type of air speed measurement. In some implementations, the airflow sensor 326 generates the airflow data for a time duration in a range of approximately 1 second to approximately 5 seconds to permit the flow 404 to stabilize (and the associated sensor measurement of the airflow sensor 326) such that the airflow data is an accurate indication of the flow rate or air speed of the flow 404.

The airflow sensor 326 transmits the airflow data to the controller 136 of the airflow detection system 122. In some implementations, the airflow sensor 326 wirelessly transmits the airflow data to the controller 136. In some implementations, the airflow sensor 326 transmits the airflow data to the controller 136 over a wired connection. In some implementations, the airflow sensor 326 streams the airflow data to the controller 136 (e.g., transmits the airflow data to the controller 136 as the airflow sensor 326 generates the airflow data). In some implementations, the airflow sensor 326 transmits the airflow data to the controller 136 at a time that occurs after the airflow sensor 326 generates the airflow data.

The controller 136 receives the airflow data and determines whether the flow rate of the flow 404 (or the air speed of the flow 404) satisfies a threshold. In some implementations, the controller 136 determines whether the flow rate of the flow 404 of the gas satisfies a flow rate threshold by determining, based on the airflow data, whether that the flow rate is equal to or less than the flow rate threshold. In some implementations, the flow rate threshold is configured to indicate that a blockage of the diffuser 112 has likely occurred if the flow rate of the flow 404 is equal to or less than the flow rate threshold. In some implementations, the flow rate threshold is configured to indicate that a blockage of the filter 118 in the transition bracket 114 has likely occurred if the flow rate of the flow 404 is equal to or less than the flow rate threshold. In some implementations, the flow rate threshold is configured to be 5% lower, 10% lower, or another percentage lower than a flow rate setting for the load port 102 or an expected flow rate through the air tunnel 320. As an example, if the flow rate setting (or the expected flow rate) is approximately 0.05 m$^3$/s, the flow rate threshold may be configured as approximately 0.045 m$^3$/s. However, other values for the flow rate threshold are within the scope of the present disclosure.

In some implementations, the controller 136 determines there is a blockage in the diffuser 112 based on determining that the flow rate is equal to or less than the flow rate threshold. In some implementations, the controller 136 determines there is a blockage in the filter 118 based on determining that the flow rate is equal to or less than the flow rate threshold. In some implementations, the controller 136 automatically causes a notification to be presented on a display of the airflow detection system 122 that a blockage has occurred, and an indication of one or more components where the blockage may have occurred. In some implementations, the controller 136 automatically causes the transport carrier 108 to be transferred to another location in the environment 100 so that the diffuser 112 and/or the filter 118 may be repaired or replaced. In some implementations, the controller 136 automatically causes the diffuser 112 and/or the filter 118 to be repaired or replaced while on the load port 102 based on determining that the flow rate is equal to or less than the flow rate threshold.

As indicated above, FIG. 4 is provided as an example. Other examples may differ from what is described with regard to FIG. 4.

Figure 5:
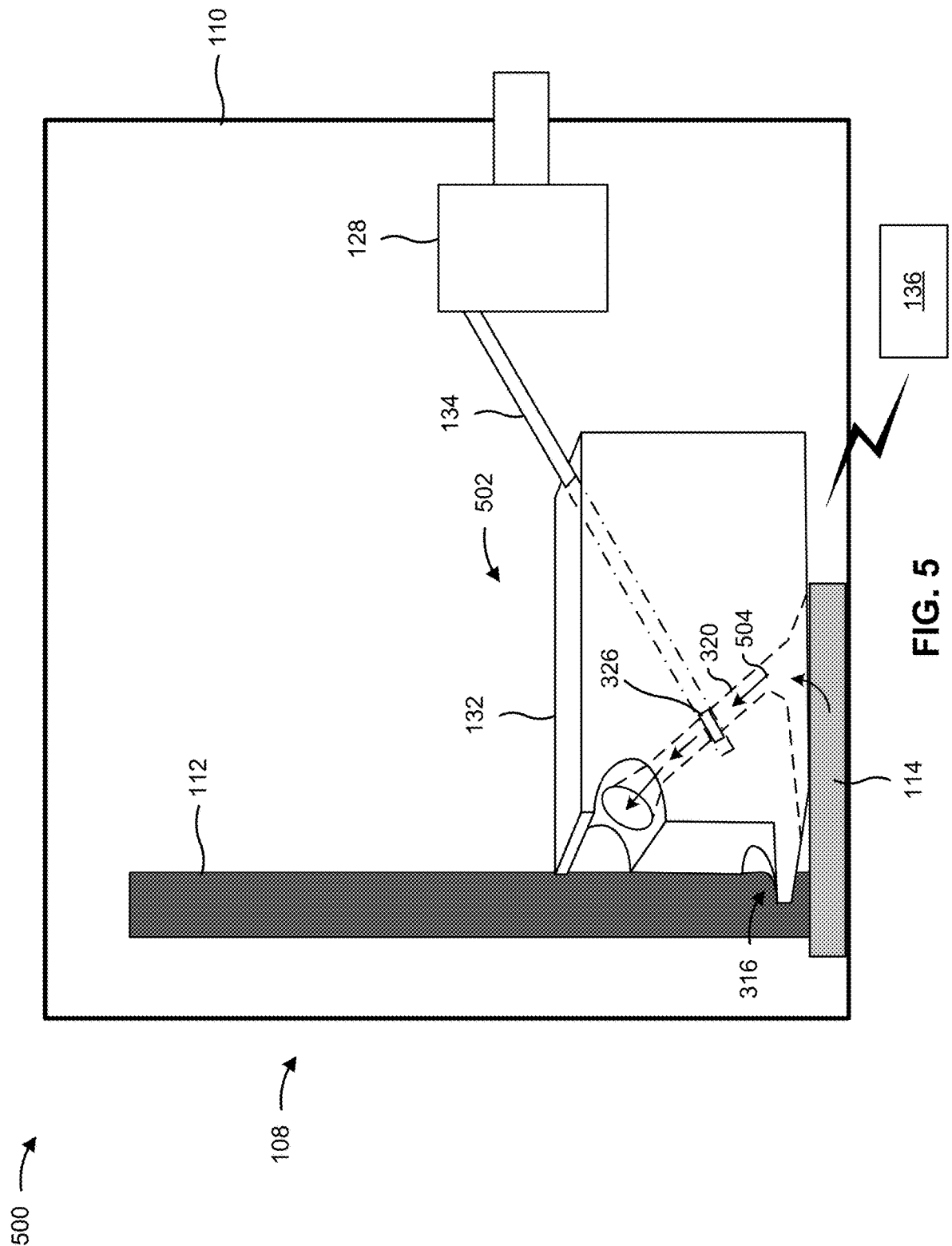

FIG. 5 is a diagram of an example implementation 500 described herein. The example implementation 500 includes an example procedure for checking the transition bracket 114 of the transport carrier 108 for a leak by the airflow detection system 122.

As shown in FIG. 5, the robot arm 128 of the airflow detection system 122 may position the airflow detection device 132 in the transport carrier 108 in an orientation 502 to interface the airflow detection device 132 with the transition bracket 114. The orientation 502 may include an orientation of the airflow detection device 132 in which the diffuser 112 is at least partially inserted into the recessed portion 316 of the airflow detection device 132, and in which the transition bracket 114 is at least partially inserted into (or flush against) the recessed portion 324 at the bottom 304 of the airflow detection device 132. In some implementations, the airflow detection device 132 is orientated in the orientation 502 in a range of approximately 60 degrees to approximately 90 degrees relative to an orientation (e.g., the orientation 402) in which the airflow detection device 132 is used to check the diffuser 112 and/or the filter 118 for a blockage. However, other values for the relative orientation of the airflow detection device 132 are within the scope of the present disclosure.

In some implementations, the controller 136 transmits a signal to the robot arm 128 to cause the robot arm 128 to position the airflow detection device 132 in the transport carrier 108 in the orientation 502. In some implementations, the controller 136 causes the robot arm 128 to position the airflow detection device 132 in the transport carrier 108 based on determining that the transport carrier 108 is positioned on the load port 102. In some implementations, the controller 136 causes the robot arm 128 to position the airflow detection device 132 in the transport carrier 108 based on receiving an instruction to initiate a test of the transport carrier 108. In some implementations, the controller 136 causes the robot arm 128 to position the airflow detection device 132 in the orientation 502 after the diffuser 112 and/or the filter 118 are checked for blockages. In these implementations, the controller 136 causes the robot arm 128 to rotate the airflow detection device 132 from the orientation (e.g., the orientation 402) in which the airflow detection device 132 is used to check the diffuser 112 and/or the filter 118 for a blockage to the orientation 502.

With the airflow detection device 132 orientated in the orientation 502, the load port 102 provides a gas into the transport carrier 108 through the transition bracket 114 and the diffuser 112. If a leak in the transition bracket 114 is present, the gas may flow into the air tunnel 320 through the opening 322 in the recessed portion 324. The gas flows through the air tunnel 320 past the airflow sensor 326 and out of the air tunnel 320 through the opening 318 at the opposing end of the air tunnel 320.

The airflow sensor 326 generates airflow data of a flow 504 of the gas through the air tunnel 320. The airflow data includes a signal, a communication, a voltage, a current, and/or another type of data based on the flow 504 of the gas. In some implementations, the airflow sensor 326 generates the airflow data based on a flow rate of the flow 504 of the gas through the air tunnel 320. The flow rate may be indicated as a cubic meters per second ($m^3/s$) volumetric flow rate or another type of flow rate measurement. In some implementations, the airflow sensor 326 generates the airflow data based on an air speed of the flow 504 of the gas through the air tunnel 320. The air speed may be indicated as a meters per second (m/s) air speed or another type of air speed measurement. In some implementations, the airflow sensor 326 generates the airflow data for a time duration in a range of approximately 1 second to approximately 5 seconds to permit the flow 504 to stabilize (and the associated sensor measurement of the airflow sensor 326) such that the airflow data is an accurate indication of the flow rate or air speed of the flow 504.

The airflow sensor 326 transmits the airflow data to the controller 136 of the airflow detection system 122. In some implementations, the airflow sensor 326 wirelessly transmits the airflow data to the controller 136. In some implementations, the airflow sensor 326 transmits the airflow data to the controller 136 over a wired connection. In some implementations, the airflow sensor 326 streams the airflow data to the controller 136 (e.g., transmits the airflow data to the controller 136 as the airflow sensor 326 generates the airflow data). In some implementations, the airflow sensor 326 transmits the airflow data to the controller 136 at a time that occurs after the airflow sensor 326 transmits the airflow data.

The controller 136 receives the airflow data and determines whether the flow rate of the flow 504 (or the air speed of the flow 504) satisfies a threshold. In some implementations, the controller 136 determines whether the flow rate of the flow 504 of the gas satisfies a flow rate threshold by determining, based on the airflow data, whether that the flow rate is equal to or greater than the flow rate threshold. In some implementations, the flow rate threshold is configured to indicate that a leak of the transition bracket 114 has likely occurred if the flow rate of the flow 504 is equal to or greater than the flow rate threshold. In some implementations, the flow rate threshold is configured to be 5% greater, 10% greater, or another percentage lower than an expected flow rate through the air tunnel 320. As an example, if the expected flow rate is approximately 0.01 $m^3/s$, the flow rate threshold may be configured as approximately 0.011 $m^3/s$. However, other values for the flow rate threshold are within the scope of the present disclosure.

In some implementations, the controller 136 determines there is a leak in the transition bracket 114 based on determining that the flow rate is equal to or greater than the flow rate threshold. In some implementations, the controller 136 automatically causes a notification to be presented on a display of the airflow detection system 122 that a leak in the transition bracket 114 has occurred. In some implementations, the controller 136 automatically causes the transport carrier 108 to be transferred to another location in the environment 100 so that the transition bracket 114 or one or more components of the transition bracket 114 (e.g., one or more of the gaskets 120) may be repaired or replaced. In some implementations, the controller 136 automatically causes the transition bracket 114 or one or more components of the transition bracket 114 to be repaired or replaced while on the load port 102 based on determining that the flow rate is equal to or greater than the flow rate threshold.

As indicated above, FIG. 5 is provided as an example. Other examples may differ from what is described with regard to FIG. 5.

Figure 6:
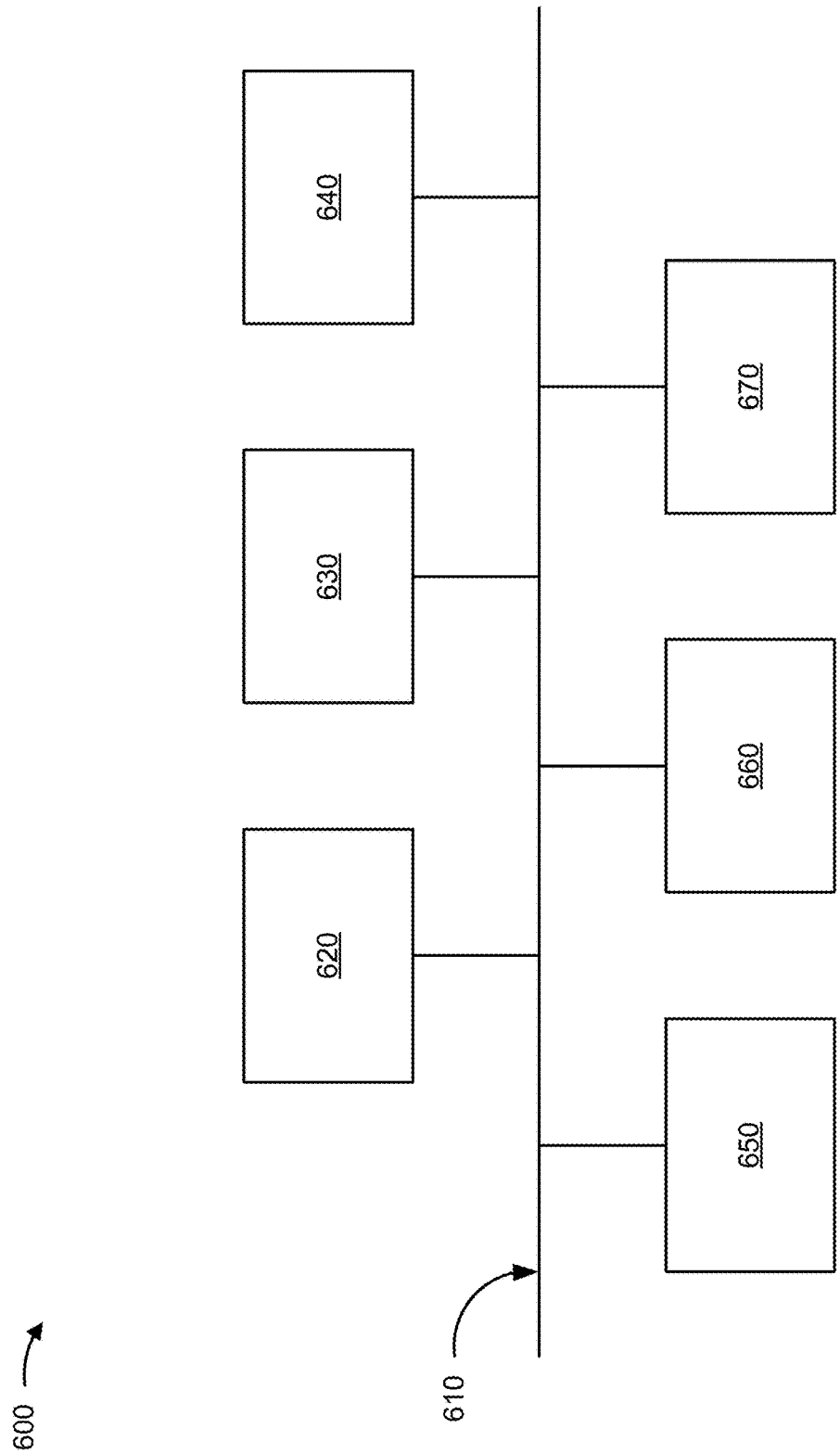
FIG. 6 is a diagram of example components of one or more devices of FIG. 1.

FIG. 6 is a diagram of example components of a device 600. In some implementations, the load port 102, the airflow detection system 122, the robot arm 128, the controller 136, and/or the airflow sensor 326 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
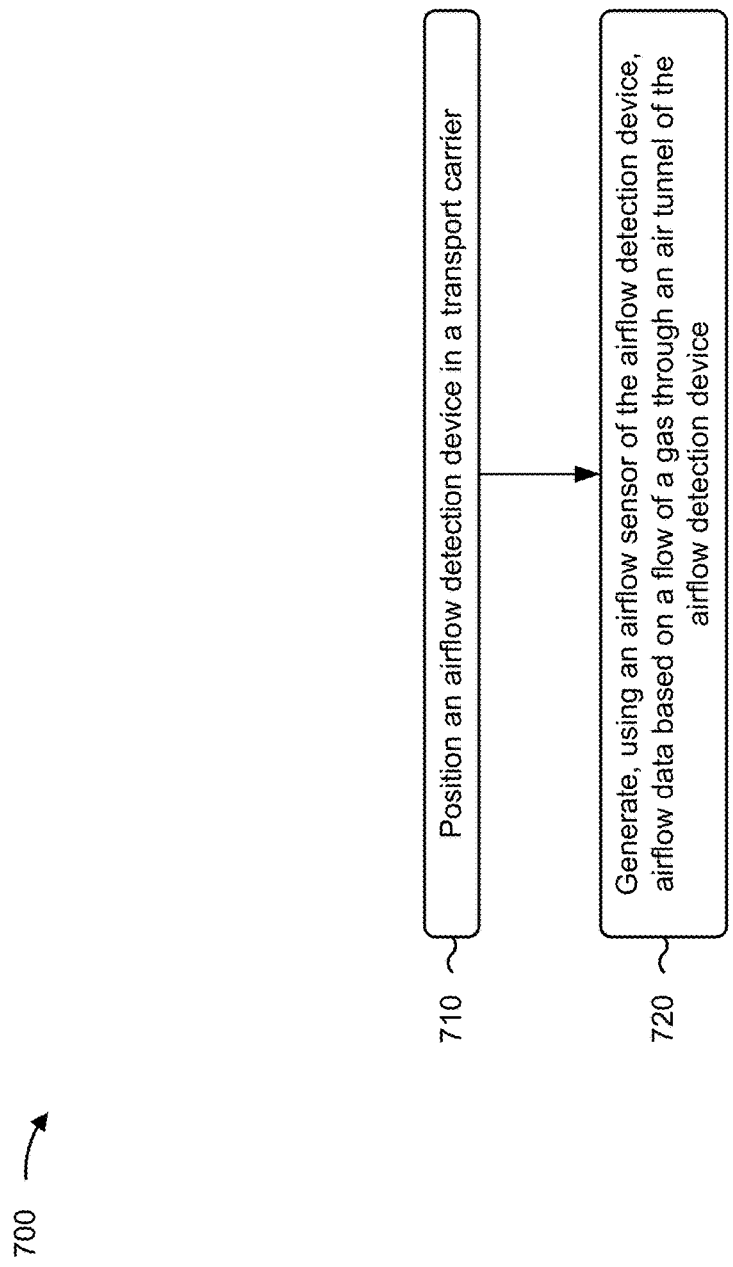
FIG. 7 is a flowchart of an example process relating to using an airflow detection device to generate airflow data.

FIG. 7 is a flowchart of an example process 700 associated with using an airflow detection device to generate airflow data. In some implementations, one or more process blocks of FIG. 7 may be performed by an airflow detection system (e.g., the airflow detection system 122). In some implementations, one or more process blocks of FIG. 7 may be performed by another device or a group of devices separate from or including the airflow detection system, such as a robot arm (e.g., the robot arm 128), an airflow detection device (e.g., the airflow detection device 132), a controller (e.g., the controller 136), and/or another component. Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include positioning an airflow detection device in a transport carrier (block 710). For example, the airflow detection system 122 (e.g., using the robot arm 128) may position the airflow detection device 132 in the transport carrier 108, as described above.

As further shown in FIG. 7, process 700 may include generating, using an airflow sensor of the airflow detection device, airflow data based on a flow of a gas through an air tunnel of the airflow detection device (block 720). For example, the airflow detection system 122 may generate, using the airflow sensor 326 of the airflow detection device 132, airflow data based on a flow (e.g., the flow 404 and/or 504) of a gas through the air tunnel 320 of the airflow detection device 132, as described above.

Process 700 may include additional implementations, such as any single implementation or any combination of implementations described below and/or in connection with one or more other processes described elsewhere herein.

In a first implementation, positioning the airflow detection device 132 in the transport carrier 108 includes positioning the airflow detection device 132 in the transport carrier 108 in a first orientation (e.g., the orientation 402), and generating the airflow data includes generating first airflow data based on a first flow (e.g., the flow 404) of the gas through the air tunnel 320 while the airflow detection device 132 is orientated in the first orientation. In a second implementation, alone or in combination with the first implementation, process 700 includes rotating the airflow detection device 132 to position the airflow detection device 132 in the transport carrier 108 in a second orientation (e.g., the orientation 502) different from the first orientation (e.g., the orientation 402), and generating second airflow data based on a second flow (e.g., the flow 504) of the gas through the air tunnel 320 while the airflow detection device 132 is orientated in the second orientation.

In a third implementation, alone or in combination with one or more of the first and second implementations, the first flow (e.g., the flow 404) of the gas is associated with the diffuser 112 of the transport carrier 108, and the second flow (e.g., the flow 504) of the gas is associated with the transition bracket 114 of the transport carrier. In a fourth implementation, alone or in combination with one or more of the first through third implementations, generating the airflow data includes generating the airflow data for a time duration in a range of approximately 1 second to approximately 5 seconds.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
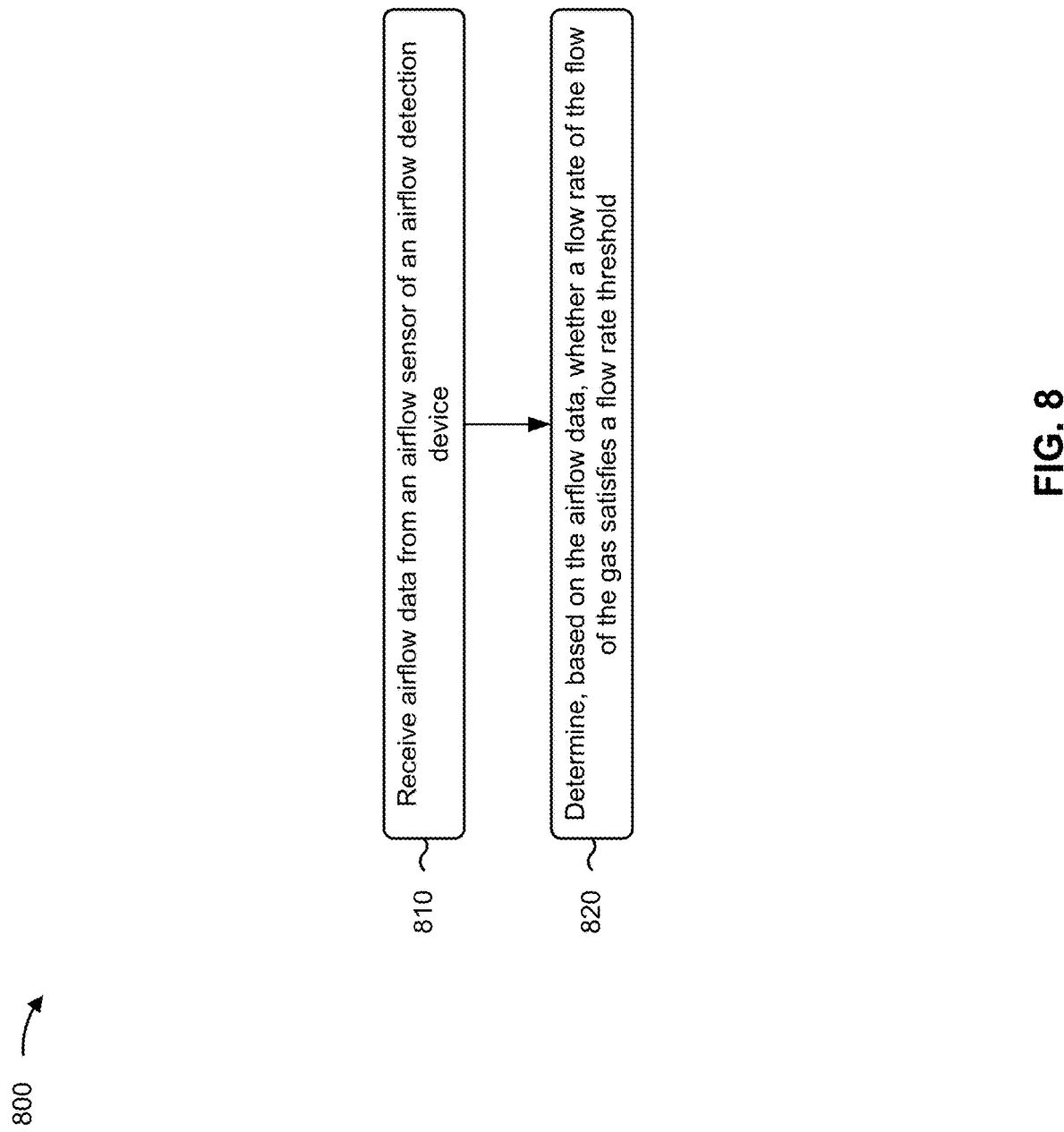
FIG. 8 is a flowchart of an example process relating to detecting one or more airflow issues with a transport carrier.

FIG. 8 is a flowchart of an example process 800 associated with detecting one or more airflow issues with a transport carrier. In some implementations, one or more process blocks of FIG. 8 may be performed by a controller (e.g., the controller 136). In some implementations, one or more process blocks of FIG. 8 may be performed by another device or a group of devices separate from or including the controller, such as an airflow detection system (e.g., the airflow detection system 122), a robot arm (e.g., the robot arm 128), an airflow detection device (e.g., the airflow detection device 132), and/or another component. Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include receiving airflow data from an airflow sensor of an airflow detection device (block 810). For example, the controller 136 may receive airflow data from the airflow sensor 326 of the airflow detection device 132, as described above. In some implementations, the airflow data is based on a flow (e.g., the flow 404 and/or 504) of a gas through the air tunnel 320 of the airflow detection device 132. In some implementations, the flow of the gas is associated with a component of the transport carrier 108.

As further shown in FIG. 8, process 800 may include determining, based on the airflow data, whether a flow rate of the flow of the gas satisfies a flow rate threshold (block 820). For example, the controller 136 may determine, based on the airflow data, whether a flow rate of the flow of the gas satisfies a flow rate threshold, as described above.

Process 800 may include additional implementations, such as any single implementation or any combination of implementations described below and/or in connection with one or more other processes described elsewhere herein.

In a first implementation, the component includes the transition bracket 114, and determining whether the flow rate satisfies the flow rate threshold includes determining that the flow rate is equal to or greater than the flow rate threshold. In a second implementation, alone or in combination with the first implementation, process 800 includes determining (e.g., by the controller 136) there is an air leak in the transition bracket 114 based on determining that the flow rate is equal to or greater than the flow rate threshold.

In a third implementation, alone or in combination with one or more of the first and second implementations, the component includes the diffuser 112, and determining whether the flow rate satisfies the flow rate threshold comprises determining that the flow rate is equal to or less than the flow rate threshold. In a fourth implementation, alone or in combination with one or more of the first through third implementations, process 800 includes determining (e.g., by the controller 136) there is a blockage in the diffuser 112 based on determining that the flow rate is equal to or less than the flow rate threshold. In a fifth implementation, alone or in combination with one or more of the first through fourth implementations, process 800 includes determining, based on determining that the flow rate is equal to or less than the flow rate threshold, there is a blockage in the filter 118 included in the transition bracket 114 of the transport carrier 108.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, the airflow detection device is capable of detecting airflow issues associated with a transport carrier, such as a blockage of a diffuser in a transport carrier or leakage of a transition bracket, among other examples. The airflow detection device includes an air tunnel through which a gas in a transport carrier may flow. The airflow detection device includes an airflow sensor configured to generate airflow data based on a flow of the gas through the air tunnel. In some implementations, the airflow detection device is included in an airflow detection system to perform automated measurements and to determine, identify, and/or detect airflow issues associated with a transport carrier. In this way, the airflow detection system may perform one or more automated actions (or may cause one or more other devices to perform one or more automated actions) based on a detection of a diffuser blockage or a transition bracket leak, such as automatically transferring a transport carrier to another location for repair, automatically repairing a transport carrier, and/or other automated actions. This may increase the effectiveness of transport carriers and reduce downtime of transport carriers, which may increase semiconductor wafer yield, may decrease semiconductor wafer defects, and/or may reduce semiconductor wafer repairs.

As described in greater detail above, some implementations described herein provide a method. The method includes positioning an airflow detection device in a transport carrier. The method includes generating, using an airflow sensor of the airflow detection device, airflow data based on a flow of a gas through an air tunnel of the airflow detection device.

As described in greater detail above, some implementations described herein provide a method. The method includes receiving, at a processor of an airflow detection system, airflow data from an airflow sensor of an airflow detection device, where the airflow data is based on a flow of a gas through an air tunnel of the airflow detection device, and where the flow of the gas is associated with a component of a transport carrier. The method includes determining, by the processor and based on the airflow data, whether a flow rate of the flow of the gas satisfies a flow rate threshold.

As described in greater detail above, some implementations described herein provide an airflow detection device. The airflow detection device includes an air tunnel. The airflow detection device includes an airflow sensor configured to measure a flow of a gas, in the air tunnel, associated with a transport carrier. The airflow detection device includes one or more recessed portions configured to interface with a diffuser in the transport carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
positioning an airflow detection device in a transport carrier in a first orientation;
generating, using an airflow sensor of the airflow detection device, first airflow data based on a first flow of a gas through an air tunnel of the airflow detection device while the airflow detection device is orientated in the first orientation;
positioning the airflow detection device in the transport carrier in a second orientation different from the first orientation; and
generating second airflow data based on a second flow of the gas through the air tunnel while the airflow detection device is orientated in the second orientation.

2. The method of claim 1, wherein positioning the airflow detection device in the transport carrier in the second orientation comprises:
rotating the airflow detection device.

3. The method of claim 1, wherein the first flow of the gas is associated with a diffuser of the transport carrier; and
wherein the second flow of the gas is associated with a transition bracket of the transport carrier.

4. The method of claim 1, wherein generating the first airflow data comprises:
generating the first airflow data for a time duration in a range of approximately 1 second to approximately 5 seconds.

5. The method of claim 1, wherein the first orientation is in a range of approximately 60 degrees to approximately 90 degrees relative to the second orientation.

6. A method, comprising:
receiving, at a processor of an airflow detection system, airflow data from an airflow sensor of an airflow detection device,
  wherein the airflow data is based on a flow of a gas through an air tunnel of the airflow detection device, and
  wherein the flow of the gas is associated with a component of a transport carrier; and
determining, by the processor and based on the airflow data, an air leak or a blockage in the component based on whether a flow rate of the flow of the gas satisfies a flow rate threshold.

7. The method of claim 6, wherein the component includes a transition bracket; and
wherein determining the air leak or the blockage in the component based on whether the flow rate satisfies the flow rate threshold comprises:
determining that the flow rate is equal to or greater than the flow rate threshold.

8. The method of claim 7, wherein determining the air leak in the component comprises:
determining the air leak in the transition bracket based on determining that the flow rate is equal to or greater than the flow rate threshold.

9. The method of claim 6, wherein the component includes a diffuser; and
wherein determining the air leak or the blockage in the component based on whether the flow rate satisfies the flow rate threshold comprises:
determining that the flow rate is equal to or less than the flow rate threshold.

10. The method of claim 9, wherein determining the blockage in the component comprises:
determining the blockage in the diffuser based on determining that the flow rate is equal to or less than the flow rate threshold.

11. The method of claim 6, wherein determining the blockage in the component comprises:
determining, based on determining that the flow rate is equal to or less than the flow rate threshold, the blockage in a filter included in a transition bracket of the transport carrier.

12. A method, comprising:
interfacing an airflow detection device with a diffuser of a transport carrier;
generating, using an airflow sensor of the airflow detection device, first airflow data based on a first flow of a gas through an air tunnel of the airflow detection device while the airflow detection device is interfacing with the diffuser;
transmitting the first airflow data to a controller;
interfacing the airflow detection device with a transition bracket of the transport carrier;
generating, using the airflow sensor, second airflow data based on a second flow of the gas through the air tunnel while the airflow detection device is interfacing with the transition bracket; and
transmitting the second airflow data to the controller.

13. The method of claim 12, wherein the airflow detection device is positioned in a first orientation when interfacing with the diffuser; and
wherein the airflow detection device is positioned in a second orientation when interfacing with the transition bracket.

14. The method of claim 13, wherein the first orientation is in a range of approximately 60 degrees to approximately 90 degrees relative to the second orientation.

15. The method of claim 13, wherein the airflow detection device is positioned in the first orientation after generating the second airflow data.

16. The method of claim 13, wherein the diffuser is at least partially inserted into a recessed portion of the airflow detection device when the airflow detection device is positioned in the first orientation.

17. The method of claim 16, wherein interfacing the airflow detection device with the transition bracket comprises interfacing a second recessed portion of the airflow detection device with the transition bracket.

18. The method of claim 13, wherein the transition bracket is at least partially inserted into or flush against a recessed portion of the airflow detection device when the airflow detection device is positioned in the second orientation.

19. The method of claim 18, wherein the diffuser is at least partially inserted into another recessed portion of the airflow detection device when the airflow detection device is positioned in the second orientation.

20. The method of claim 19, wherein interfacing the airflow detection device with the diffuser comprises interfacing a first recessed portion of the airflow detection device with the diffuser.

* * * * *